(12) United States Patent
Mueller et al.

(10) Patent No.: US 11,049,720 B2
(45) Date of Patent: Jun. 29, 2021

(54) REMOVABLE OPAQUE COATING FOR ACCURATE OPTICAL TOPOGRAPHY MEASUREMENTS ON TOP SURFACES OF TRANSPARENT FILMS

(71) Applicant: KLA Corporation, Milpitas, CA (US)

(72) Inventors: Dieter Mueller, San Jose, CA (US);
Prasanna Dighe, San Ramon, CA (US);
Xiaomeng Shen, San Jose, CA (US);
Jason Saito, San Jose, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 16/597,131

(22) Filed: Oct. 9, 2019

(65) Prior Publication Data
US 2020/0126786 A1     Apr. 23, 2020

Related U.S. Application Data

(60) Provisional application No. 62/748,300, filed on Oct. 19, 2018.

(51) Int. Cl.
*H01L 21/027*     (2006.01)
*B82Y 20/00*       (2011.01)
(Continued)

(52) U.S. Cl.
CPC .......... *H01L 21/0276* (2013.01); *B82Y 20/00* (2013.01); *G01B 11/2441* (2013.01); *G03F 7/091* (2013.01); *H01L 22/12* (2013.01)

(58) Field of Classification Search
CPC .................................................. H01L 21/0276
See application file for complete search history.

(56) References Cited

U.S. PATENT DOCUMENTS

| | | | |
|---|---|---|---|
| 5,004,340 A | 4/1991 | Tullis et al. | 356/243 |
| 5,710,069 A * | 1/1998 | Farkas | B24B 37/04 |
| | | | 216/85 |

(Continued)

FOREIGN PATENT DOCUMENTS

WO     WO 2018-067677 A1     11/2011

OTHER PUBLICATIONS

PCT/US2019/056839, International Search Report, dated Mar. 25, 2020.

(Continued)

*Primary Examiner* — William Coleman
(74) *Attorney, Agent, or Firm* — Huse IP Law; Charles C. Huse

(57) ABSTRACT

A method of using removable opaque coating for accurate optical topography measurements on top surfaces of transparent films includes: depositing a highly reflective coating onto a top surface of a wafer, measuring topography on the highly reflective coating, and removing the highly reflective coating from the wafer. The highly reflective coating includes an organic material. The highly reflective coating comprises a refractive index value between one and two. The highly reflective coating comprises a complex wavelength greater than one at six-hundred and thirty-five nanometers. The highly reflective coating reflects at least twenty percent of incident light. The highly reflective coating when deposited maintains an underlayer pattern topography at a resolution of forty by forty micrometers. The highly reflective coating does not cause destructive stress to the wafer.

18 Claims, 5 Drawing Sheets

WAFER MANIPULATOR FLOWCHART

(51) Int. Cl.
    *G03F 7/09*        (2006.01)
    *H01L 21/66*      (2006.01)
    *G01B 11/24*     (2006.01)

(56) References Cited

U.S. PATENT DOCUMENTS

| | | |
|---|---|---|
| 7,001,642 B2* | 2/2006 | Terry ............... G02B 1/105 |
| | | 427/387 |
| 10,180,316 B2* | 1/2019 | Brodmann ......... G01N 21/4738 |
| 2003/0131536 A1* | 7/2003 | Kostinko ............ A61K 8/25 |
| | | 51/308 |
| 2010/0112730 A1 | 5/2010 | Brodsky et al. ............... 438/7 |
| 2012/0211081 A1* | 8/2012 | Yamazaki ........... H01L 31/1804 |
| | | 136/261 |
| 2016/0086819 A1* | 3/2016 | Sakashita .......... H01L 21/28556 |
| | | 438/669 |
| 2018/0090307 A1 | 3/2018 | Brunner et al. .............. 359/385 |
| 2018/0195855 A1 | 7/2018 | Liu et al. |
| 2019/0085209 A1* | 3/2019 | Dockery ................... C09G 1/02 |
| 2020/0298368 A1* | 9/2020 | Osterheld ............... G06T 7/529 |

OTHER PUBLICATIONS

PCT/US2019/056839, Written Opinion of the International Searching Authority, dated Mar. 25, 2020.

\* cited by examiner

LIGHT REFLECTIONS FROM MULTIPLE INTERFACES
BETWEEN TRANSPARENT LAYERS

LIGHT REFLECTION ONLY FROM THE TOP
SURFACE COATED WITH OPAQUE COATING

WAFER MEASURING PROCESS

WAFER MANIPULATOR FLOWCHART

REMOVABLE OPAQUE COATING FOR ACCURATE OPTICAL TOPOGRAPHY MEASUREMENTS ON TOP SURFACES OF TRANSPARENT FILMS

CROSS REFERENCE TO RELATED APPLICATIONS

This application claims priority under 35 U.S.C. § 119 from U.S. Provisional Application No. 62/748,300, entitled "REMOVABLE OPAQUE COATING FOR ACCURATE OPTICAL TOPOGRAPHY MEASUREMENTS ON TOP SURFACES OF TRANSPARENT FILMS," filed on Oct. 19, 2018, the subject matter of which is incorporated herein by reference.

TECHNICAL FIELD

The described embodiments relate generally to optical topography measurement and more particularly to improved optical topography measurements on top surfaces of transparent films using removable opaque coating.

BACKGROUND INFORMATION

Optical topography measurements on transparent films on semiconductor wafers are impacted by transparent films effects affecting the accuracy of the measurement. Existing techniques used to compensate for transparent films effects are based on correction models which require additional information about the optical properties and thickness of the film(s). If this additional information about films properties is incorrect or incomplete, the correction will be inaccurate. While correction models may be useful in experimental or engineering analysis with well-known actual optical films properties, they are too complex and too time consuming for production metrology in high volume manufacturing environments with varying actual films properties.

SUMMARY

In a first novel aspect, a method of using removable opaque coating for accurate optical topography measurements on top surfaces of transparent films includes: depositing a highly reflective coating onto a top surface of a wafer, measuring topography on the highly reflective coating, and removing the highly reflective coating from the wafer.

In a second novel aspect, the highly reflective coating includes an organic material.

In a third novel aspect, the highly reflective coating comprises a refractive index value between one and two.

In a fourth novel aspect, the highly reflective coating comprises a complex wavelength greater than one at six-hundred and thirty-five nanometers.

In a fifth novel aspect, the highly reflective coating reflects at least twenty percent of incident light.

In a sixth novel aspect, the highly reflective coating when deposited maintains an underlayer pattern topography at a resolution of at least forty by forty micrometers.

In a seventh novel aspect, the highly reflective coating does not cause shape changing stress to the wafer.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to background examples and some embodiments of the invention, examples of which are illustrated in the accompanying drawings. In the description and claims below, relational terms such as "top", "down", "upper", "lower", "top", "bottom", "left" and "right" may be used to describe relative orientations between different parts of a structure being described, and it is to be understood that the overall structure being described can actually be oriented in any way in three-dimensional space.

Wafer shape and topography metrology is an important area and is gaining increasing importance in semiconductor industry. Many inline wafer processing steps comprise the use of one or more transparent layers. Wafers often are fabricated on top of a substrate that is also at least partially transparent. When using optical metrology to measure characteristics of an at least partially transparent layer, not all of the incident light reflects from the top surface. The light that does not reflect from the top surface of the at least partially transparent layer, travels through the at least partially transparent layer and then reflects from other subsequent surfaces. These reflections from subsequent surfaces cause inaccurate optical measurements of the top surface of the at least partially transparent layer. The reason for the inaccuracy is that the light reflecting from the top surface cannot be differentiated from the light reflecting from the bottom surface of the at least partially transparent layer. Therefore, what is a contour on the bottom surface of the at least partially transparent layer may appear as a contour on the top surface of the at least partially transparent layer.

Figure 1:
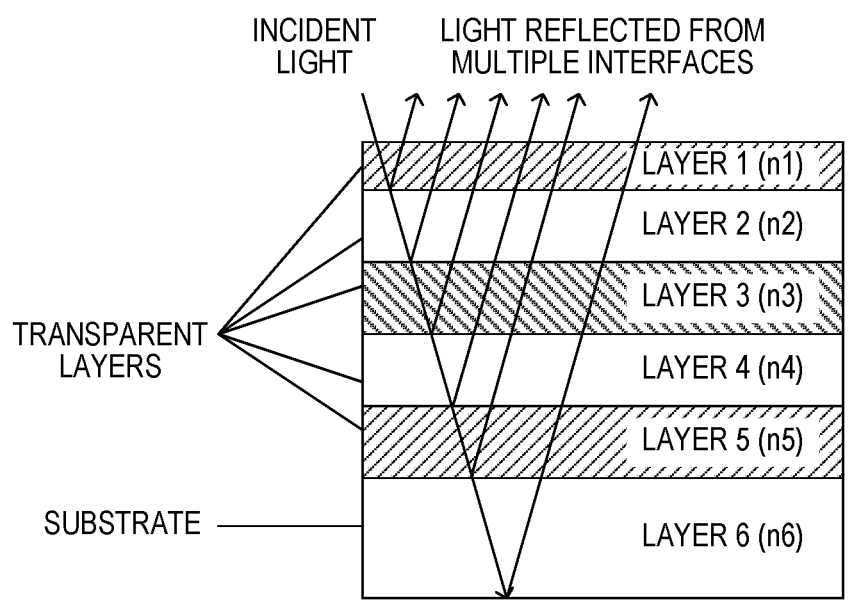
FIG. 1 is a diagram illustrating light reflections from multiple interfaces between transparent layers.

FIG. 1 illustrates the multiple reflections of incident light upon the top surface of an at least partially transparent layer. The wafer illustrated in FIG. 1 comprises six layers. Layer six (n6) is a substrate that is partially transparent. Layers one through five are also at least partially transparent. During optical inspection an incident light is directed to the top surface of layer one. In this example, measurement of the characteristics of the top surface of layer one is desired. However, due to the at least partial transparency of the layer one the indictment light is not totally reflected by layer one. Rather, a portion of the incident light travels through layer one and reflects from the surface interface between layer one and layer two. A portion of the incident light also travels through two and reflects from the surface interface between layer two and layer three. A portion of the incident light also travels through layer three and reflects from the surface interface between layer three and layer four. A portion of the incident light also travels through layer four and reflects from the surface interface between layer four and layer five.

A portion of the incident also travels through layer five and reflects from the surface interface between layer five and layer six. A portion of the incident light also travels through layer six and reflects from the bottom surface of layer six. Accordingly, FIG. 1 illustrates that multiple reflections of the incident light from the wafer are produced that are not reflections from the desired top surface of the top transparent layer. To improve measurement of characteristics of the top surface of the transparent layer a new method is needed.

Figure 2:
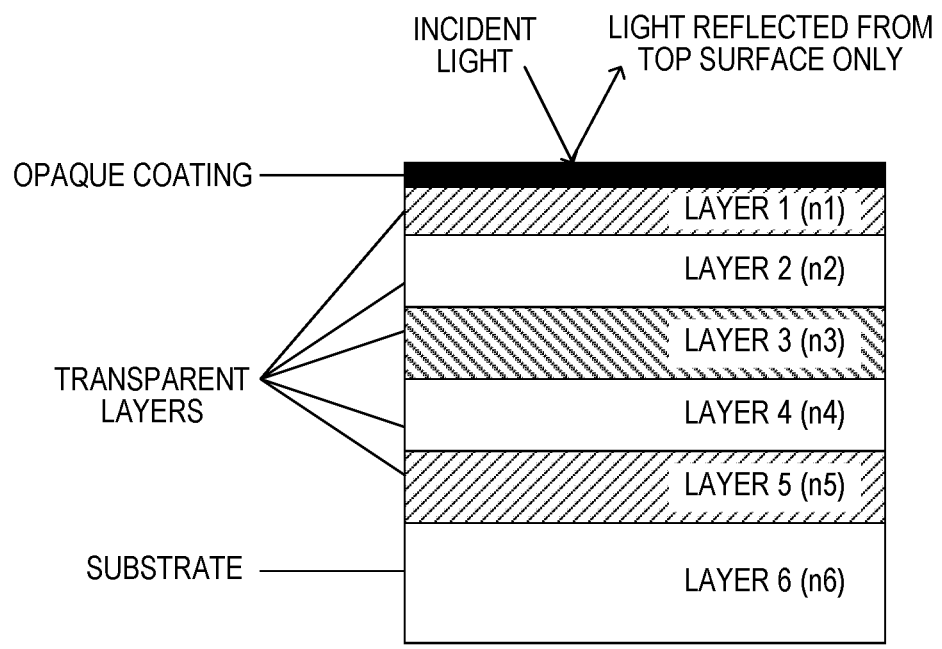
FIG. 2 is a diagram illustrating light reflection only from the top surface high reflectivity coating.

A new method is illustrated in FIG. 2. FIG. 2 illustrates high reflectivity coating, also referred to as a "physical layer", to improve optical measurements of the transparent layer top surface. A highly reflective coating is deposited on the top surface of the transparent layer top surface. The highly reflective coating is deposited such that the highly reflective coating has an even thickness across the top surface of the top transparent layer. The even thickness of the deposited highly reflective coating ensures that the top surface of the deposited highly reflective coating matches the top surface of the first transparent layer. In one example, the highly reflective coating material reflects at least twenty percent of the incident light. The increased reflectivity of the high reflectivity coating increases the ability to differentiate, based on light intensity, the light reflected from the highly reflective coating from light reflected from the subsequent layers.

In one example, the highly reflective coating is an organic material, such as a type of photoresist.

In another example, the highly reflective coating has a refractive index value between one and two.

In another example, the highly reflective coating comprises a complex wavelength greater than one at six-hundred and thirty-five nanometers.

In another example, the highly reflective coating reflects at least twenty percent of incident light.

In another example, the highly reflective coating when deposited maintains an underlayer pattern topography at a resolution of forty by forty micrometers.

In another example, the highly reflective coating does not cause destructive stress to the top transparent layer top surface.

In another example, the highly reflective coating does not cause destructive stress to the top transparent layer.

In another example, the highly reflective coating does not cause destructive or shape or topography changing stress to the wafer.

In another example, the highly reflective coating does not comprise metal.

In another example, the highly reflective coating is opaque.

Figure 3:
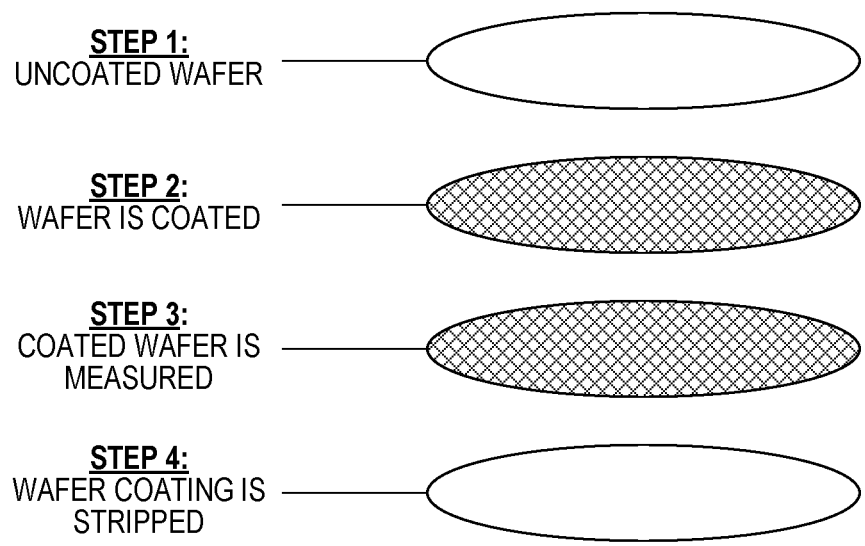
FIG. 3 is a diagram illustrating multiple steps of a wafer measuring process.

FIG. 3 illustrates the steps for measuring the top surface characteristics of a transparent layer using a highly reflective coating. In step one, the top surface of the top transparent layer of a wafer is not coated. In step two, the top surface of the top transparent layer of the wafer is coated in a highly reflective coating. In one example, the coating is an organic, non-metallic, material. In another example, the coating is a metallic layer. The coating prevents reflections from the bottom of transparent films or internal interfaces of the film stacks. Therefore, only the light reflected from the top surface is used to measure wafer top surface topology. It is noted herein, use of organic material for coating is advantageous in that deposition of organic films does not increase films stress to levels where stress induces wafer bending.

In step three, topography of the top surface of the wafer coated in highly reflective coating is measured. Measuring top surface topography after coating the wafer provides a more accurate optical topography measurement in the presence of transparent films since transparent films effects such as distortion of the reflected phase or loss of variation of reflected light intensity are avoided.

In step four, the highly reflective coating is removed. The highly reflective coating can be removed using various methodologies. In one example, the highly reflective coating is removed using a solvent. Solvents include, but are not limited to, propylene glycol methyl ether, ethyl lactate, tetramethylammonium hydroxide.

Figure 4:
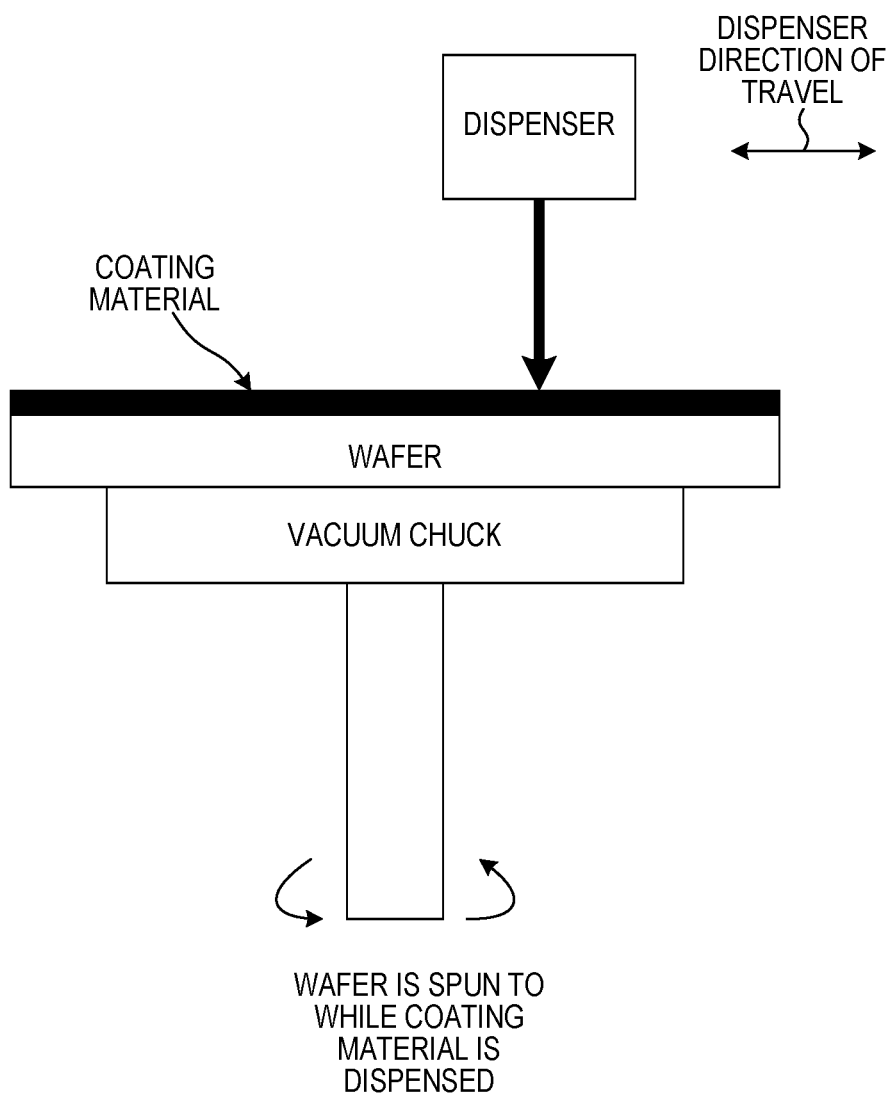
FIG. 4 is a diagram illustrating a wafer high reflectivity coating process.

FIG. 4 illustrates a method for depositing the highly reflective coating to the top surface of the wafer. The wafer is in contact with a vacuum chuck. A dispenser of the highly reflective material is located above the wafer. The wafer is then rotated while the dispenser dispenses the highly reflective material onto the top surface of the wafer. While the wafer is rotated by the vacuum chuck, the dispenser is moved so to deposit the highly reflective material at the center of the wafer or at the outer edge of the wafer and all positions in between.

Figure 5:
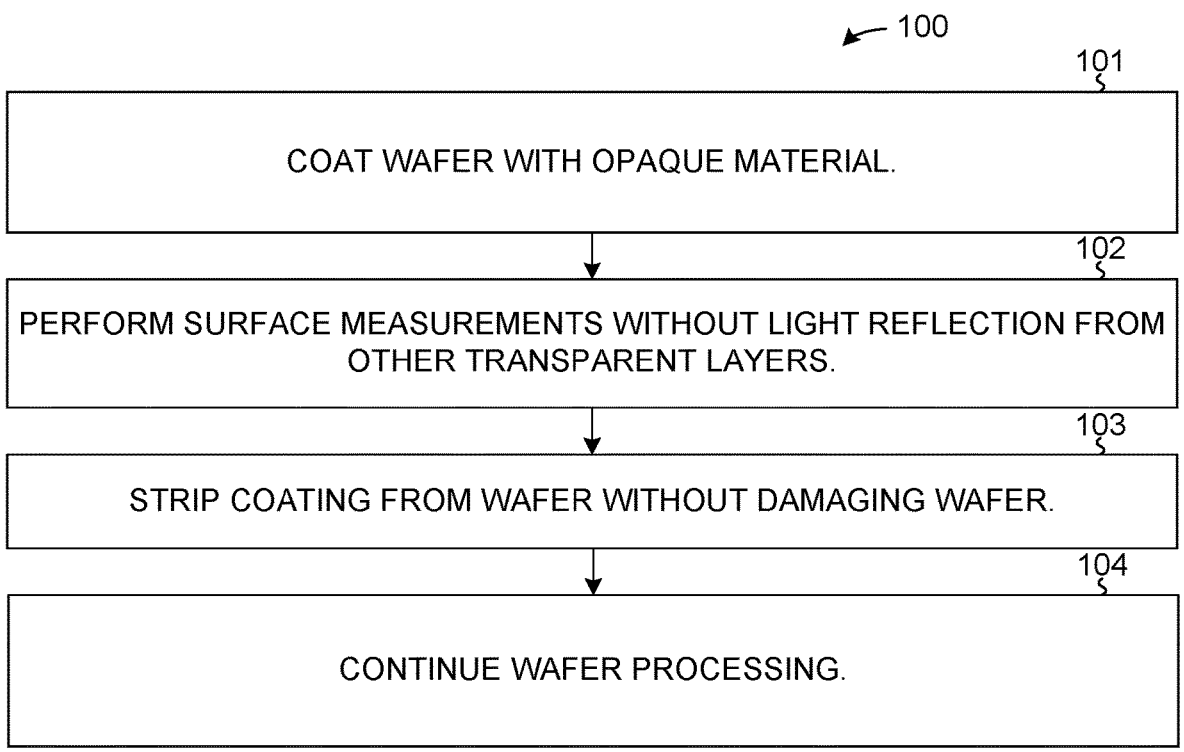
FIG. 5 is a flowchart 100 describing high reflectivity wafer coating process.

FIG. 5 is a flowchart describing the steps of removable opaque coating for accurate optical topography measurements on top surfaces of transparent films. In step 101, a highly reflective coating is disposed onto the top surface of the wafer. In step 102, top surface topography measurements are made of the highly reflective coating. In one example, The surface topography measurement is performed using an optical interferometry based full wafer geometry metrology platform that can measure wafer shape, wafer flatness, dual-sided nanotopography and high-resolution edge roll-off.

In step 103, once the stop surface topography measurements are completed, the highly reflective coating is removed from the wafer without damaging the wafer. In one example, the reflective coating is removed using solvents, such as propylene glycol methyl ether, ethyl lactate, tetramethylammonium hydroxide. In step 104, the wafer is is further processed for final use.

This method of using removable opaque coating for accurate optical topography measurements on top surfaces of transparent films allows:

Accurate measurement of top surface topography
Prevent physical damage to top surface of wafer when topography is measured by way of physical contact with the wafer.
Faster measurement time by using optical measurements.
Fast removal of the high reflectivity coating by solvent wash.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A method, comprising:
   depositing a layer of opaque coating onto a wafer;
   measuring topography on the layer of opaque coating; and
   after measuring the topography, removing the layer of opaque coating from the wafer.

2. The method of claim 1, wherein the layer of opaque coating comprises organic material.

3. The method of claim 1, wherein the layer of opaque coating has a refractive index value between one and two.

4. The method of claim 1, wherein the layer of opaque coating reflects at least twenty percent of incident light.

5. The method of claim 1, wherein the layer of opaque coating when deposited maintains an underlayer pattern topography at a resolution of forty by forty micrometers.

6. The method of claim 1, wherein the layer of opaque coating does not cause destructive stress to the wafer.

7. The method of claim 1, wherein the layer of opaque coating does not comprise metal material.

8. The method of claim 1, wherein the wafer comprises a layer of transparent material.

9. The method of claim 1, wherein the depositing of the layer of opaque coating is performed by a spin coater.

10. The method of claim 1, wherein measuring the topography is performed using optical interferometry.

11. The method of claim 1, wherein measuring the topography comprises measuring the wafer shape.

12. The method of claim 1, wherein measuring the topography comprises measuring wafer flatness.

13. The method of claim 1, wherein measuring the topography comprises measuring dual-sided nanotopography.

14. The method of claim 1, wherein measuring the topography comprises measuring edge roll-off.

15. The method of claim 1, wherein the removing of the layer of opaque coating is performed using a solvent.

16. The method of claim 15, wherein the solvent is propylene glycol methyl ether.

17. The method of claim 15, wherein the solvent is ethyl lactate.

18. The method of claim 15, wherein the solvent is tetramethylammonium hydroxide.

\* \* \* \* \*